(12) United States Patent
Zhu et al.

(10) Patent No.: US 12,464,862 B2
(45) Date of Patent: Nov. 4, 2025

(54) SEMICONDUCTOR STRUCTURES AND METHODS OF MANUFACTURING THE SAME

(71) Applicant: ENKRIS SEMICONDUCTOR, INC., Jiangsu (CN)

(72) Inventors: Dandan Zhu, Jiangsu (CN); Liyang Zhang, Jiangsu (CN); Kai Cheng, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 455 days.

(21) Appl. No.: 17/781,357

(22) PCT Filed: Jun. 11, 2020

(86) PCT No.: PCT/CN2020/095668
§ 371 (c)(1),
(2) Date: May 31, 2022

(87) PCT Pub. No.: WO2021/248415
PCT Pub. Date: Dec. 16, 2021

(65) Prior Publication Data
US 2023/0006091 A1 Jan. 5, 2023

(51) Int. Cl.
*H01L 21/02* (2006.01)
*H10H 20/01* (2025.01)
(Continued)

(52) U.S. Cl.
CPC ........ *H10H 20/8215* (2025.01); *H10H 20/01* (2025.01); *H10H 20/8162* (2025.01);
(Continued)

(58) Field of Classification Search
CPC . H01L 33/007; H01L 33/0075; H01L 33/025; H01L 33/145; H01L 33/44
See application file for complete search history.

(56) References Cited

U.S. PATENT DOCUMENTS

| | | | |
|---|---|---|---|
| 8,334,549 B2 * | 12/2012 | Lin | H10H 20/8162 257/E33.023 |
| 2007/0153857 A1 * | 7/2007 | Chua | H10H 20/81 372/49.01 |

(Continued)

FOREIGN PATENT DOCUMENTS

| | | |
|---|---|---|
| CN | 1443373 A | 9/2003 |
| CN | 101601142 A | 12/2009 |

(Continued)

OTHER PUBLICATIONS

ISA State Intellectual Property Office of the People's Republic of China, International Search Report Issued in Application No. PCT/CN2020/095668, Jan. 26, 2021, WIPO, 4 pages.

(Continued)

*Primary Examiner* — John A Bodnar
(74) *Attorney, Agent, or Firm* — Christopher R. Carroll; The Small Patent Law Group LLC (57) ABSTRACT

This application provides semiconductor structures and methods of manufacturing the same. A semiconductor structure includes: an N-type semiconductor layer, a light emitting layer, and a P-type ion doped layer that are disposed from bottom to up, wherein the P-type ion doped layer comprises an activated region and non-activated regions located on two sides of the activated region, P-type doping ions in the activated region are activated, and P-type doping ions in the non-activated region are passivated. The layout of the activated region and the non-activated regions makes an LED include: a high-efficiency light emitting region and light emitting obstacle regions located on two sides of the high-efficiency light emitting region.

18 Claims, 4 Drawing Sheets

(51) Int. Cl.
*H10H 20/81* (2025.01)
*H10H 20/816* (2025.01)
*H10H 20/84* (2025.01)
*H10H 20/825* (2025.01)

(52) U.S. Cl.
CPC ....... *H10H 20/84* (2025.01); *H10H 20/01335* (2025.01); *H10H 20/0137* (2025.01); *H10H 20/034* (2025.01); *H10H 20/825* (2025.01)

(56) References Cited

U.S. PATENT DOCUMENTS

| | | | |
|---|---|---|---|
| 2008/0118998 A1 | 5/2008 | Lin et al. | |
| 2011/0090006 A1* | 4/2011 | Yamazaki | H10D 86/481 327/581 |
| 2011/0133159 A1 | 6/2011 | Jiang et al. | |
| 2013/0234110 A1* | 9/2013 | Kato | H10H 20/816 438/47 |
| 2015/0048421 A1 | 2/2015 | Park et al. | |
| 2019/0123239 A1 | 4/2019 | Shatalov et al. | |

FOREIGN PATENT DOCUMENTS

| | | | | |
|---|---|---|---|---|
| CN | 102067340 A | | 5/2011 | |
| CN | 101601142 | * | 2/2012 | ............ H01L 33/00 |
| CN | 104716236 B | | 3/2017 | |
| CN | 209561450 U | | 10/2019 | |
| JP | 2001053337 A | | 2/2001 | |
| WO | 0169659 A2 | | 9/2001 | |
| WO | 0169659 A3 | | 2/2002 | |

OTHER PUBLICATIONS

ISA State Intellectual Property Office of the People's Republic of China, Written Opinion of the International Searching Authority Issued in Application No. PCT/CN2020/095668, Jan. 26, 2021, WIPO, 5 pages. (Submitted with Machine/Partial Translation).

State Intellectual Property Office of the People's Republic of China, Office Action and Search Report Issued in Application No. 2020800975575, Jan. 27, 2025, 13 pages. (Submitted with Machine Translation).

Wang Bing et al,"Optimized growth of p-type AlGaN electron blocking layer in the GaN-based LED", Acta Phys. Sin., 2011, 60(1): 016108. doi: 10.7498/aps.60.016108, 6 pages. (Submitted with abstract translation).

* cited by examiner

| S1 | Provide an N-type semiconductor layer, a light emitting layer, a P-type ion doped layer, and a blocking material layer that are disposed from bottom to up |

| S2 | Pattern the blocking material layer to form a blocking layer, wherein the blocking layer has at least one opening to expose a part of the P-type ion doped layer; using the blocking layer as a mask, P-type doping ions in the exposed part of the P-type ion doped layer are activated to form an activated region, and the P-type ion doped layer covered by the blocking layer form non-activated regions |

| S3 | Remove parts of the P-type ion doped layer and the light emitting layer to expose a part of the N-type semiconductor layer, form an N electrode on the exposed part of N-type semiconductor layer, and form an ohmic contact between the N electrode and the N-type semiconductor layer; form a P electrode on the activated region, and form an ohmic contact between the P electrode and the activated region |

SEMICONDUCTOR STRUCTURES AND METHODS OF MANUFACTURING THE SAME

TECHNICAL FIELD

This application relates to the field of semiconductor technologies, and in particular, to semiconductor structures and methods of manufacturing the same.

BACKGROUND

Group III nitride semiconductor materials have the advantages of a large band gap (0.7 eV to 6.2 eV), a high carrier saturation migration rate, a high breakdown electric field, a good thermal conductivity, etc., and are very suitable for manufacturing blue, green, and ultraviolet LED devices, as well as high-frequency, high-power, and electromagnetic radiation resistant integrated electronic devices.

How to improve the light intensity and luminous efficiency, and reduce the production cost of LEDs based on the group III nitride semiconductor materials is a focus of LED industry. A main object of current research is to provide a reliable structure to increase an optical power, thereby greatly improving the grade of LED products.

SUMMARY

An object of the present disclosure is to provide semiconductor structures and methods of manufacturing the same, which can improve the light intensity and luminous efficiency of LEDs and reduce their production cost.

In order to achieve the object, an aspect of the present disclosure provides a semiconductor structure, including:
  an N-type semiconductor layer, a light emitting layer, and a P-type ion doped layer that are distributed from the bottom up, wherein the P-type ion doped layer includes an activated region and non-activated regions located on two sides of the activated region, P-type doping ions in the activated region are activated, and P-type doping ions in the non-activated regions are passivated.

Optionally, the P-type ion doped layer includes at least two activated regions and at least three non-activated regions, and the at least two activated regions and the at least three non-activated regions are distributed at intervals.

Optionally, the semiconductor structure further includes a blocking layer located on the non-activated regions to expose the activated region.

Optionally, materials of the blocking layer include: SiNx, N-type GaN, or a combination of SiNx and N-type GaN.

Optionally, the light emitting layer and the P-type ion doped layer expose a part of the N-type semiconductor layer, an N electrode is provided on the exposed part of the N-type semiconductor layer, and an ohmic contact is formed between the N electrode and the N-type semiconductor layer; a P electrode is provided on the activated region, and an ohmic contact is formed between the P electrode and the activated region.

Optionally, P electrodes on the activated regions are electrically connected together.

Optionally, the light emitting layer includes a single quantum well structure or a multiple quantum well structure.

Optionally, materials of the N-type semiconductor layer include group III nitride materials, and/or materials of the light emitting layer include group III nitride materials, and/or materials of the P-type ion doped layer include group III nitride materials.

Optionally, an electron blocking layer is provided between the light emitting layer and the P-type ion doped layer.

Another aspect of the present disclosure provides a method for manufacturing a semiconductor structure, including:
  providing an N-type semiconductor layer, a light emitting layer, a P-type ion doped layer, and a blocking material layer that are disposed from bottom to up;
  patterning the blocking material layer to form a blocking layer, wherein the blocking layer has at least one opening to expose a part of the P-type ion doped layer;
  activating, by the blocking layer as a mask, P-type doping ions in the exposed part of the P-type ion doped layer to form an activated region, determining an unexposed part of the P-type ion doped layer covered by the blocking layer as non-activated regions.

Optionally, there are a plurality of openings in the blocking layer to form at least two activated regions and at least three non-activated regions, and the activated regions and the non-activated regions are distributed at intervals.

Optionally, the method of manufacturing a semiconductor structure further includes: removing the blocking layer to expose the non-activated regions.

Optionally, materials of the blocking material layer include: SiNx, N-type GaN or a combination of SiNx and N-type GaN.

Optionally, the P-type doping ions are activated through annealing at a temperature greater than 500° C.

Optionally, the P-type doping ions are activated in an atmosphere of nitrogen, a mixed gas of nitrogen and oxygen, nitrous oxide, or argon.

Optionally, a growth temperature of the P-type ion doped layer is in a range from 700° C. to 1200° C.

Optionally, the method of manufacturing a semiconductor structure further includes: removing parts of the P-type ion doped layer and the light emitting layer to expose a part of the N-type semiconductor layer, forming an N electrode on the exposed part of N-type semiconductor layer, and forming an ohmic contact between the N electrode and the N-type semiconductor layer; forming a P electrode on the activated region, and forming an ohmic contact between the P electrode and the activated region.

Optionally, the light emitting layer includes a single quantum well structure or a multiple quantum well structure.

Optionally, materials of the N-type semiconductor layer include group III nitride materials, and/or materials of the light emitting layer include group III nitride materials, and/or materials of the P-type ion doped layer include group III nitride materials.

Optionally, the method of manufacturing a semiconductor structure further includes: providing an electron blocking layer between the light emitting layer and the P-type ion doped layer.

Compared with the prior art, the present disclosure has the following beneficial effects:
  1) The semiconductor structure of the present disclosure includes an N-type semiconductor layer, a light emitting layer, and a P-type ion doped layer that are disposed from bottom to up, wherein the P-type ion doped layer includes an activated region and non-activated regions located on two sides of the activated region, P-type doping ions in the activated region are activated, and P-type doping ions in the non-activated regions are passivated. The layout of the activated region and the non-activated regions makes the LED semiconductor structure include: a high-efficiency light emitting region and light emitting obstacle regions located on two sides of the high-efficiency light emitting region. The high-efficiency light emitting region includes: the activated region, a part of the light emitting layer in which directly below the activated region, and a part of the N-type semiconductor layer in which directly below the activated region. The light emitting obstacle regions include: the non-activated regions, parts of the light emitting layer in which directly below the non-activated regions, and parts of the N-type semiconductor layer in which directly below the non-activated regions. When an area of LED is certain, compared with a case where the P-type ion doped layer is entirely the activated regions, the high-efficiency light emitting region enables an electric field between the P electrode and the N electrode to be concentrated. The concentrated electric field means that an intensity of the electric field is large, and LEDs emit light in a concentrated manner, so that a luminous efficiency is improved. In addition, the blocking layer is used to selectively activate the P-type ion doped layer to avoid etching the P-type ion doped layer and damaging the light emitting layer in the high-efficiency light emitting region, and reduce defects. At the same time, due to the existence of a mask, the light emitting obstacle regions are formed on two sides of an LED device, which suppresses unevenness of emitted light caused by a non-radiative recombination effect, and improves luminous efficiency.

2) In an alternative, the P-type ion doped layer includes at least two activated regions and at least three non-activated regions, and the activated regions and the non-activated regions are distributed at intervals. A plurality of activated regions and a plurality of non-activated regions are distributed at intervals to form a plurality of alternately distributed high-efficiency light emitting regions and light emitting obstacle regions. When the area of LED is fixed, compared with one large-area light emitting region, a plurality of small-area high-efficiency light emitting regions can further increase a recombination efficiency of carriers per unit area of LED, so that the luminous efficiency is improved.

3) In an alternative, a) the light emitting layer and the P-type ion doped layer expose a part of the N-type semiconductor layer. An N electrode is provided on the exposed part of N-type semiconductor layer. An ohmic contact is formed between the N electrode and the N-type semiconductor layer. A P electrode is provided on the activated region. An ohmic contact is formed between the P electrode and the activated region. Or b) an N electrode is provided on a side of the N-type semiconductor layer away from the light emitting layer. An ohmic contact is formed between the N electrode and the N-type semiconductor layer. A P electrode is provided on the activated region. An ohmic contact is formed between the P electrode and the activated region. The alternative a) corresponds to an LED with a horizontal structure. A conduction current flows along a horizontal direction (vertical to a thickness direction of the LED). The alternative b) corresponds to an LED with a vertical structure. A conduction current flows along a vertical direction (the thickness direction of the LED).

To facilitate the understanding of the present disclosure, all reference signs appearing in the present disclosure are listed below:

Semiconductor structures 1, 2, 3, 4, 5, 6
N-type semiconductor layer 11
Light-emitting layer 12
P-type ion doped layer 13
Blocking material layer 14'
Blocking layer 14
Opening 14a
Activated region 131
Non-activated region 132
N electrode 151
P electrode 152
Passivation layer 16
Electron blocking layer 17
First region 171
Second region 172

DETAILED DESCRIPTION OF THE EMBODIMENTS

In order to make the objects, features and advantages of the present disclosure more obvious and understandable, specific embodiments of the present disclosure will be described in detail below with reference to the drawings.

Figure 1:
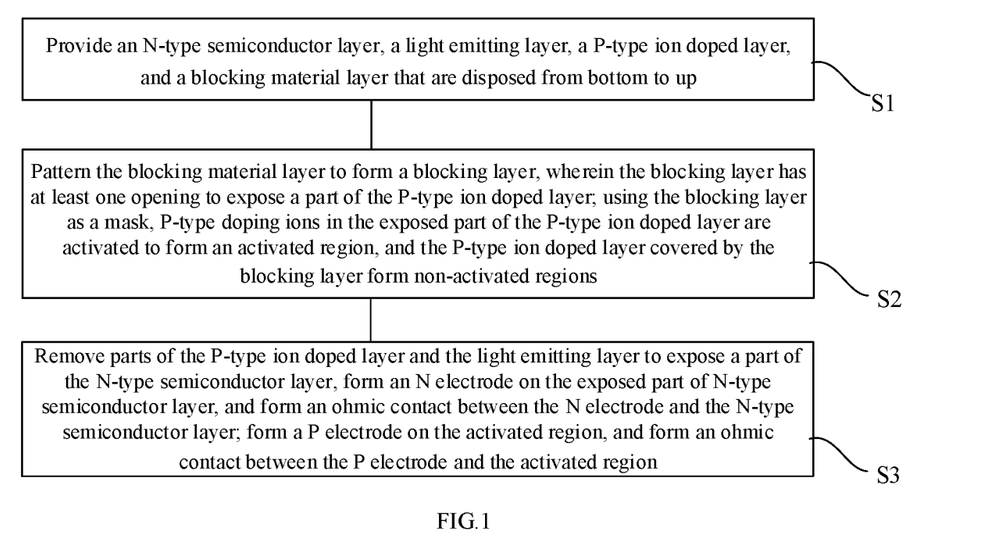
FIG. 1 is a flow chart illustrating a method for manufacturing a semiconductor structure according to a first embodiment of the present disclosure.
Figure 2:
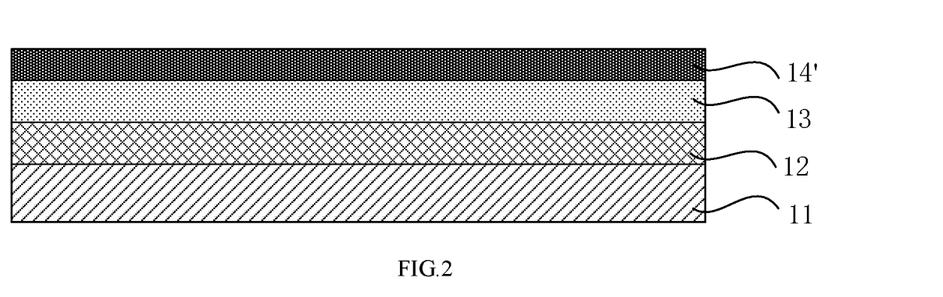
FIGS. 2 to 3 are schematic diagrams illustrating an intermediate structure corresponding to a process in FIG. 1.
Figure 3:
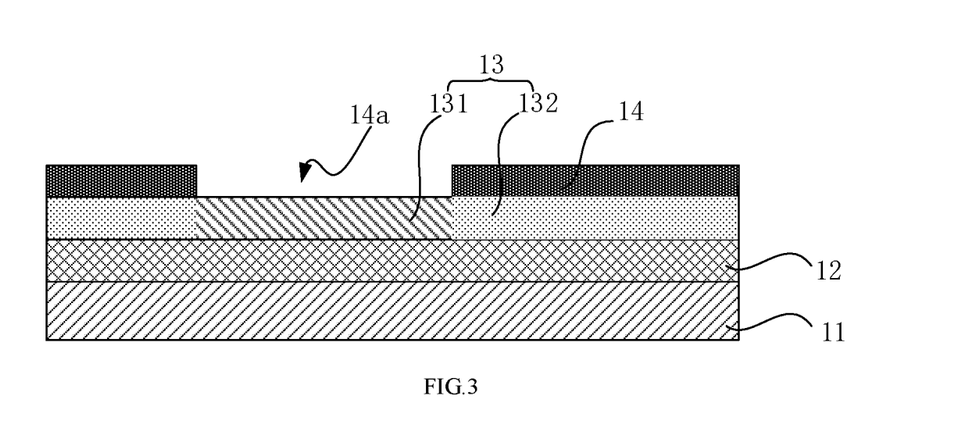
Figure 4:
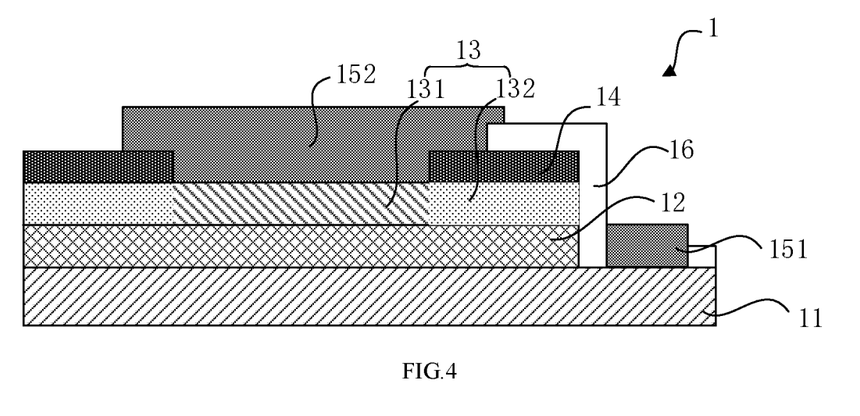
FIG. 4 is a schematic sectional diagram illustrating the semiconductor structure according to the first embodiment of the present disclosure.

FIG. 1 is a flow chart illustrating a method of manufacturing a semiconductor structure according to a first embodiment of the present disclosure. FIGS. 2 to 3 are schematic diagrams illustrating an intermediate structure corresponding to a process in FIG. 1. FIG. 4 is a schematic sectional diagram illustrating the semiconductor structure according to the first embodiment of the present disclosure.

First, referring to step S1 in FIG. 1 and FIG. 2, an N-type semiconductor layer 11, a light emitting layer 12, a P-type ion doped layer 13, and a blocking material layer 14' disposed from bottom to up are provided.

Materials of the N-type semiconductor layer 11 can be group III nitride materials, such as at least one of GaN, AlGaN, InGaN, or AlInGaN. N-type doping elements can include at least one of Si, Ge, Sn, Se, or Te.

The light emitting layer 12 can include at least one of a single quantum well structure, a multiple quantum well (MQW) structure, a quantum wire structure, or a quantum dot structure. The light emitting layer 12 can include a well layer and a barrier layer formed of the group III nitride materials.

For example, the well layer can include an $Al_xGa_{1-x}N$ layer, where x represents a percentage of a mass of Al to a sum of masses of Al and Ga, and $1 \geq x \geq 0$; and/or the barrier layer can include an $Al_yGa_{1-y}N$ layer, where y represents a percentage of a mass of Al to a sum of masses of Al and Ga, and $1 \geq y \geq 0$. A band gap of the well layer is smaller than a band gap of the barrier layer. The well layer and/or the barrier layer can be doped or not doped with Al.

Multiple well layers and multiple barrier layers are alternately disposed to form a multiple quantum well structure.

Materials of the P-type ion doped layer 13 can be group III nitride materials, such as at least one of GaN, AlGaN, InGaN, or AlInGaN. P-type doping ions can be at least one kind of Mg ions, Zn ions, Ca ions, Sr ions, or Ba ions.

In this embodiment, the blocking material layer 14' is formed on the P-type ion doped layer 13 without being activated.

In some embodiments, the blocking material layer 14' can be of a single layer structure. Materials of the single layer structure can include $SiN_x$, N-type GaN, or a combination thereof. $SiN_x$ refers to a silicon nitride in which a molar ratio of silicon to nitrogen is variable.

In other embodiments, the blocking material layer 14' can be of a multiple-layer stack structure. Materials of any layer in the multiple-layer stack structure can include $SiN_x$, N-type GaN, or a combination thereof.

In some embodiments, the step S1 can include: sequentially forming an N-type semiconductor layer 11, a light emitting layer 12, a P-type ion doped layer 13, and a blocking material layer 14' on a substrate.

The materials of the substrate can include at least one of sapphire, silicon carbide, or silicon; or at least one of sapphire, silicon carbide, or silicon, and a group III nitride material as mentioned above, which is not limited in this embodiment.

The N-type semiconductor layer 11, and/or the light emitting layer 12, and/or the P-type ion doped layer 13 can be made of group III nitride materials. The group III nitride materials can be at least one of GaN, AlGaN, InGaN, or AlInGaN. Processes for forming the group III nitride materials can include: Atomic Layer Deposition (ALD), or Chemical Vapor Deposition (CVD), or Molecular Beam Epitaxy (MBE), or Plasma Enhanced Chemical Vapor Deposition (PECVD), or Low Pressure Chemical Vapor Deposition (LPCVD), or Metal-Organic Chemical Vapor Deposition (MOCVD), or a combination thereof.

In some embodiments, a growth temperature of the P-type ion doped layer 13 is in a range from 700° C. to 1200° C., which can avoid deteriorating the previously formed light emitting layer 12 and/or the N-type semiconductor layer 11 due to a high-temperature growth, and optimize the crystal quality of the light emitting layer 12 and/or the N-type semiconductor layer 11.

In this embodiment, the blocking material layer 14' is formed on the P-type ion doped layer 13 without being activated.

When materials of the blocking material layer 14' include $SiN_x$, it is formed through Physical Vapor Deposition or Chemical Vapor Deposition. When the materials of the blocking material layer 14' include N-type GaN, refer to the process for forming the N-type semiconductor layer 11, and/or the light emitting layer 12, and/or the P-type ion doped layer 13.

Thereafter, the substrate can be removed. The removal of the substrate can be implemented through laser lift-off or chemical etching.

The substrate can be removed after step S2 or step S3 ends.

In some embodiments, the substrate may not be removed, and remain in a semiconductor structure 1.

Next, referring to step S2 in FIG. 1 and FIG. 3, the blocking material layer 14' is patterned to form a blocking layer 14. The blocking layer 14 has at least one opening 14a to expose a part of the P-type ion doped layer 13. Using the blocking layer 14 as a mask, P-type doping ions in the exposed part of the P-type ion doped layer 13 are activated to form an activated region 131, and an unexposed part of the P-type ion doped layer 13 covered by the blocking layer 14 forms non-activated regions 132.

Patterning the blocking material layer 14' can be implemented through dry etching or wet etching. Specifically, a photoresist layer is formed first on the blocking material layer 14', and the photoresist layer is patterned through exposing and then developing. Dry etching gases can be $CF_4$, $C_3F_8$, etc., and a wet etching solution can be hot phosphoric acid.

In a process environment for growth of the P-type ion doped layer 13, for example, in a growth environment using MOCVD, there are a large number of H atoms. If the H atoms are not removed, P-type doping ions (an acceptor dopant, for example, Mg ions) in the group III nitride materials will form a bond with the H atoms, that is, be passivated by a large number of H atoms without generating holes. The exposed part of the P-type ion doped layer 13 can provide an escape path for releasing the H atoms.

Therefore, the H atoms in unexposed part of the P-type ion doped layer 13 covered by the blocking layer 14 cannot escape due to the blocking layer 14, and the H atoms will be bonded to the P-type doping ions (for example, Mg ions), that is, the P-type doping ions are passivated, so that the holes cannot be generated, and the non-activated regions 132 are accordingly formed. The H atoms in the exposed part of the P-type ion doped layer 13 exposed by the opening 14a of the blocking layer 14 can escape, that is, the P-type doping ions are activated, so that the activated region 131 is accordingly formed.

It can be seen that the blocking layer 14 is used during the activation of the P-type doping ions, which enables a region of the P-type ion doped layer 13 not covered by the blocking layer 14 to form the activated region 131, and a region of the P-type ion doped layer 13 covered by the blocking layer 14 to form the non-activated regions 132. Advantages are that etching the P-type ion doped layer 13 can be avoided, and thereby the loss of the light emitting layer 12 caused by the etching can be avoided.

In some embodiments, high-temperature annealing is performed in an inactive gas, for example, annealing is performed at a temperature greater than 500° C. to activate P-type doping ions, to prevent the introduction of H atoms. In some embodiments, P-type doping ions can be activated in a gas atmosphere that does not contain hydrogen atoms, for example, in a nitrogen, a mixed gas of nitrogen and oxygen, nitrous oxide, or argon atmosphere. When high-temperature annealing is performed, nitrogen molecules and their decomposition products can effectively penetrate into the surface of a group III nitride material, which can better make up for nitrogen vacancies caused during the etching, and can improve the quality of the activated region 131.

Thereafter, referring to step S3 in FIG. 1 and FIG. 4, parts of the P-type ion doped layer 13 and the light emitting layer 12 are removed to expose the N-type semiconductor layer 11. An N electrode 151 is formed on the exposed region of the N-type semiconductor layer 11. An ohmic contact is formed between the N electrode 151 and the N-type semiconductor layer 11. A P electrode 152 is formed on the activated region 131, and an ohmic contact is formed between the P electrode 152 and the activated region 131.

Referring to FIG. 4, removing the parts of the P-type ion doped layer 13 and the light emitting layer 12 can include: first forming a photoresist mask layer on the blocking layer 14 and the activated region 131; exposing the photoresist mask layer to develop a photoresist pattern; and then using the photoresist pattern to dry or wet etch the blocking layer 14, the P-type ion doped layer 13, and the light emitting layer 12.

Specifically, before forming the photoresist mask layer, a glue removal solution (dimethyl sulfoxide) can be used to clean the intermediate structure shown in FIG. 3 in an ultrasonic state at 70° C. to 100° C. to remove organic particles on the surface, and $H_2SO_4$:$H_2O_2$:$H_2O$ (5:1:1) can be used to clean at 80° C. to 90° C. to remove metal particles on the surface and surface oxide layers.

Next, a tackifier HMDS (hexamethyl disilazane) is applied to surfaces of the blocking layer 14 and the activated region 131 to modify the surfaces of the blocking layer 14 and the activated region 131 from hydrophilicity to hydrophobicity.

After etching is completed, the remaining photoresist patterns can be removed through an ashing process.

Still referring to FIG. 4, after the parts of the P-type ion doped layer 13 and the light emitting layer 12 are removed, a passivation layer 16 can be formed on a) upper surfaces of the blocking layer 14 and the activated region 131, b) side surfaces of the blocking layer 14, the P-type ion doped layer 13 and the light emitting layer 12, and c) an upper surface of the exposed part of N-type semiconductor layer 11.

The passivation layer 16 can be made of an insulating material, such as silicon dioxide, and silicon nitride, and the passivation layer 16 can include one or more layers formed with a uniform thickness through Physical Vapor Deposition or Chemical Vapor Deposition.

Still referring to FIG. 4, the passivation layer 16 is patterned to remove at least a part of the passivation layer 16 in which of the N electrode 151 and the P electrode 152 are to be formed.

Referring to FIG. 4, materials of the N electrode 151 and the P electrode 152 can be at least one of Ti, Al, Ni, or Au. For example, the N electrode 151 and the P electrode 152 have a multiple-layer stack structure of Ti layer/Al layer/Ni layer/Au layer, or of a Ti layer/Al layer, or of an Ni layer/Au layer, which can be formed through a sputtering process.

In some embodiments, high-temperature annealing is used to form the N electrode 151 and the P electrode 152.

In some embodiments, before the N electrode 151 and the P electrode 152 are formed, ion heavily doped layers (not shown in figures) can be formed on the activated region 131 and the exposed part of N-type semiconductor layer 11. The ion heavily doped layers enable ohmic contact layers to be directly formed between the P electrode 152 and the activated region 131 and between the N electrode 151 and the N-type semiconductor layer 11 without high-temperature annealing.

Materials of the ion heavily doped layers can be group III nitride materials, for example, at least one of GaN, AlGaN, or AlInGaN. In some embodiments, a growth temperature of the ion heavily doped layers can be lower than 1000° C., preferably lower than 800° C., to prevent the secondary passivation of the activated P-type doping ions.

During the growth of the ion heavily doped layers, the passivation layer 16 can be used as a blocking layer to prevent an ion heavily doped layer from being formed thereon.

In some embodiments, an ion heavily doped layer can be formed on at least one of the activated region 131 or the exposed part of N-type semiconductor layer 11.

For the P electrode 152 and the activated region 131 not provided with the ion heavily doped layers, or the N electrode 151 and the N-type semiconductor layer 11 not provided with the ion heavily doped layers, an ohmic contact layer can be formed through high-temperature annealing.

Referring to FIG. 4, the semiconductor structure 1 includes:

an N-type semiconductor layer 11, a light emitting layer 12, a P-type ion doped layer 13, and a blocking layer 14 disposed from bottom to up. The P-type ion doped layer 13 includes an activated region 131, and non-activated regions 132 located on two sides of the activated region 131. P-type doping ions in the activated region 131 are activated, and P-type doping ions in the non-activated regions 132 are passivated. The blocking layer 14 is located on the non-activated regions 132 to expose the activated region 131. The light emitting layer 12 and the P-type ion doped layer 13 expose a part of the N-type semiconductor layer 11. An N electrode 151 is provided on the exposed part of N-type semiconductor layer 11. An ohmic contact is formed between the N electrode 151 and the N-type semiconductor layer 11. A P electrode 152 is provided on the activated region 131. An ohmic contact is formed between the P electrode 152 and the activated region 131.

According to the positions where the N electrode 151 and the P electrode 152 are provided, it can be seen that the semiconductor structure 1 corresponds to an LED with a horizontal structure, that is, a conduction current flows along a horizontal direction (vertical to a thickness direction of the semiconductor structure 1).

In some embodiments, the N electrode 151 can be provided on a side of the N-type semiconductor layer 11 away from the light emitting layer 12. Since the P electrode 152 is formed on a side of the activated region 131 away from the light emitting layer 12, the semiconductor structure corresponds to an LED with a vertical structure, that is, a conduction current flows along a vertical direction (a thickness direction of the semiconductor structure).

The layout of the activated region 131 and the non-activated regions 132 makes the LED semiconductor structure include: a high-efficiency light emitting region and light emitting obstacle regions located on two sides of the high-efficiency light emitting region. The high-efficiency light emitting region includes: the activated region 131, a part of the light emitting layer 12 in which directly below the activated region 131, and a part of the N-type semiconductor layer 11 in which directly below the activated region 131. The light emitting obstacle regions include: the non-activated regions 132, parts of the light emitting layer 12 in which directly below the non-activated regions 132, and parts of the N-type semiconductor layer 11 in which directly below the non-activated regions 132. When an area of LED is certain, compared with a case where the P-type ion doped layer 13 is entirely the activated regions 131, the high-efficiency light emitting region enables an electric field between the P electrode 152 and the N electrode 151 to be concentrated. The concentrated electric field means that an intensity of the electric field is large and a recombination efficiency of carriers per unit area of LED is increased, so that a luminous efficiency is improved.

In addition, the blocking layer 14 is used to selectively activate the P-type ion doped layer 13 to avoid etching the P-type ion doped layer 13 and damaging the light emitting layer 12 in the high-efficiency light emitting region, reduce defects and possibilities of non-radiative recombination, and improve the luminous efficiency.

Figure 5:
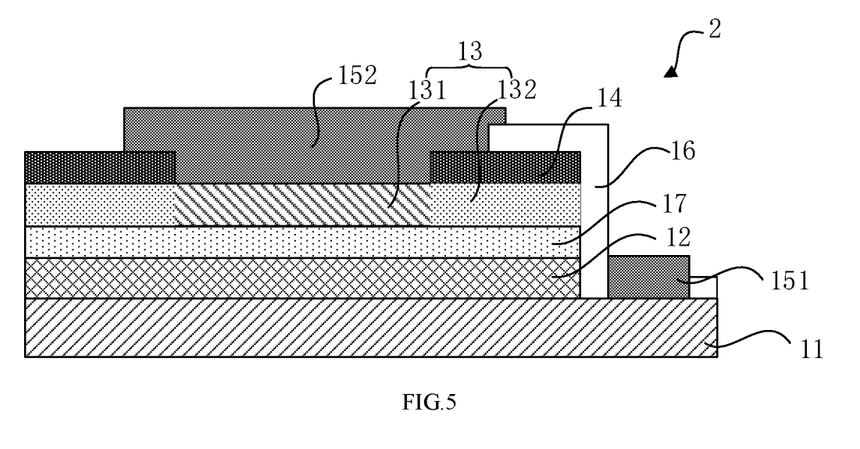
FIG. 5 is a schematic sectional diagram illustrating a semiconductor structure according to a second embodiment of the present disclosure.

FIG. 5 is a schematic sectional diagram illustrating a semiconductor structure according to a second embodiment of the present disclosure.

Referring to FIG. 5, a semiconductor structure 2 according to the second embodiment is substantially the same as the semiconductor structure 1 according to the first embodiment, except that the semiconductor structure 2 further includes: an electron blocking layer 17 located between the light emitting layer 12 and the P-type ion doped layer 13.

The electron blocking layer 17 can prevent the entry of electrons from the light emitting layer 12 to the P-type ion doped layer 13, thereby increasing the probability of recombining electrons and holes in the light emitting layer 12, and improving the luminous efficiency. Materials of the electron blocking layer 17 can be group III nitride materials, for example, at least one of GaN, AlGaN, or AlInGaN.

Correspondingly, for the manufacturing method, in the step S1, the electron blocking layer 17 is provided between the light emitting layer 12 and the P-type ion doped layer 13; or the electron blocking layer 17 is formed after the light emitting layer 12, and the P-type ion doped layer 13 is formed on the electron blocking layer 17.

Figure 6:
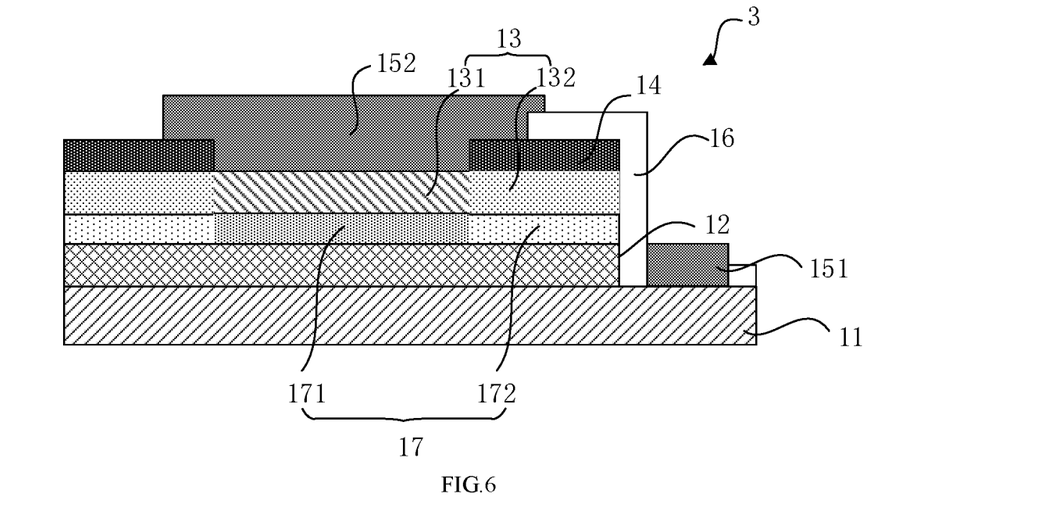
FIG. 6 is a schematic sectional diagram illustrating a semiconductor structure according to a third embodiment of the present disclosure.

FIG. 6 is a schematic sectional diagram illustrating a semiconductor structure according to a third embodiment of the present disclosure.

Referring to FIG. 6, a semiconductor structure 3 according to the third embodiment is substantially the same as the semiconductor structure 2 according to the second embodiment, except that the electron blocking layer 17 includes P-type doping ions, and the electron blocking layer 17 includes a first region 171 and second regions 172.

The P-type doping ions in the first region 171 can be activated in the same process as the P-type ion doped layer 13. Regions of the electron blocking layer 17 where the P-type doping ions are not activated form the second regions 172. In other words, an orthographic projection of the first region 171 of the electron blocking layer 17 on a plane where the N-type semiconductor layer 11 is located coincides with an orthographic projection of the activated region 131 of the P-type ion doped layer 13 on the plane where the N-type semiconductor layer 11 is located. Orthographic projections of the second regions 172 of the electron blocking layer 17 on the plane where the N-type semiconductor layer 11 are located coincide with orthographic projections of the non-activated regions 132 of the P-type ion doped layer 13 on the plane where the N-type semiconductor layer 11 is located.

The type of the P-type ions in the electron blocking layer 17 can refer to the P-type ions in the P-type ion doped layer 13.

Correspondingly, for the manufacturing method, in the step S1, the P-type ion doped layer 13 is formed on the electron blocking layer 17 without being activated, and in the step S2, the electron blocking layer 17 and the P-type ion doped layer 13 form the activated region in the same process. The electron blocking layer 17 and the P-type ion doped layer 13 are regarded as a whole, and the H atoms therein escape from the opening 14a.

Figure 7:
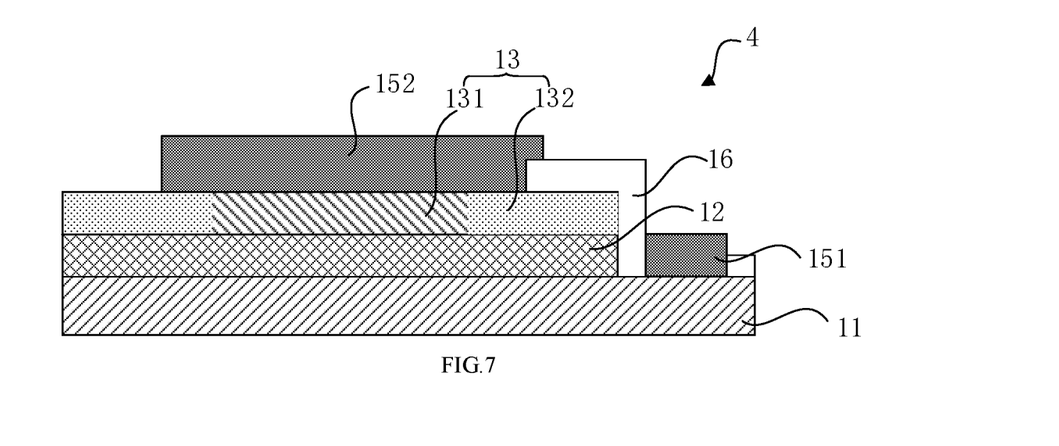
FIG. 7 is a schematic sectional diagram illustrating a semiconductor structure according to a fourth embodiment of the present disclosure.

FIG. 7 is a schematic sectional diagram illustrating a semiconductor structure according to a fourth embodiment of the present disclosure.

Referring to FIG. 7, a semiconductor structure 4 according to the fourth embodiment is substantially the same as the semiconductor structures 1, 2, and 3 according to the first, second, and third embodiments, except that the blocking layer 14 is omitted.

Omitting the blocking layer 14 can reduce the thickness of the semiconductor structure 4, which is beneficial to the miniaturization of a device.

Correspondingly, for the manufacturing method, in the step S2, after the P-type ion doped layer 13 is activated, the blocking layer 14 is removed to expose the non-activated regions 132. Since the P-type doping ions in the non-activated regions 132 cannot generate holes, the non-activated regions 132 have an electrical insulation property.

Figure 8:
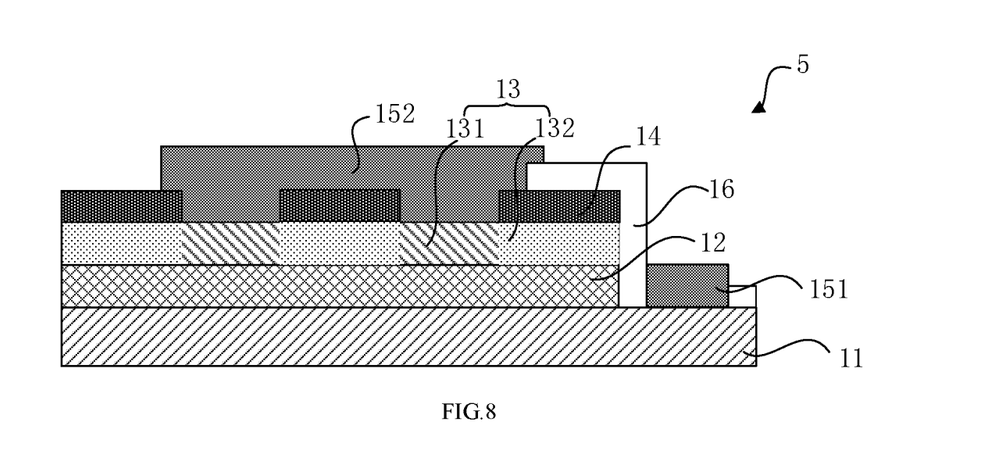
FIG. 8 is a schematic sectional diagram illustrating a semiconductor structure according to a fifth embodiment of the present disclosure.

FIG. 8 is a schematic sectional diagram illustrating a semiconductor structure according to a fifth embodiment of the present disclosure.

Referring to FIG. 8, a semiconductor structure 5 according to the fifth embodiment is substantially the same as the semiconductor structures 1, 2, 3, and 4 according to the first, second, third, and fourth embodiments, except that the P-type ion doped layer 13 includes at least two activated regions 131 and at least three non-activated regions 132; the activated regions 131 and the non-activated regions 132 are distributed at intervals; and P electrodes 152 on the activated regions 131 are electrically connected together.

A plurality of activated regions 131 and a plurality of non-activated regions 132 are distributed at intervals to form a plurality of alternately distributed high-efficiency light emitting regions and light emitting obstacle regions. When the area of LED is fixed, compared with one large-area high-efficiency light emitting region, a plurality of small-area high-efficiency light emitting regions can further increase the electric field concentration of an LED, and emitted light is more concentrated, which can further improve the light intensity.

Correspondingly, for the manufacturing method, in the step S2, the blocking layer 14 has at least two openings 14a.

In some embodiments, the P electrodes 152 on the activated regions 131 may not be electrically connected together.

In some embodiments, the P-type ion doped layer 13 includes at least M activated regions 131 and at least M+1 non-activated regions 132, and the activated regions 131 and the non-activated regions 132 are distributed at intervals, where M is a positive integer, and M≥3.

Figure 9:
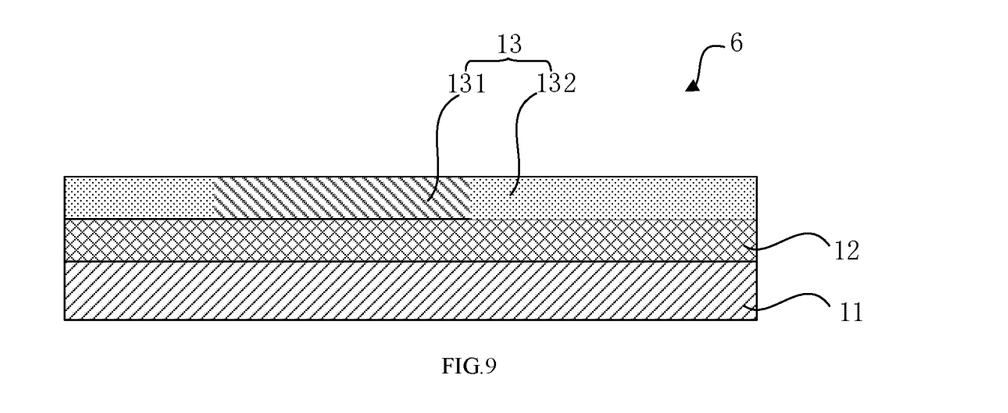
FIG. 9 is a schematic sectional diagram illustrating a semiconductor structure according to a sixth embodiment of the present disclosure.

FIG. 9 is a schematic sectional diagram illustrating a semiconductor structure according to a sixth embodiment of the present disclosure.

Referring to FIG. 9, a semiconductor structure 6 according to the sixth embodiment is substantially the same as the semiconductor structures 1, 2, 3, 4, and 5 according to the first, second, third, fourth, and fifth embodiments, except that the N electrode 151 and the P electrode 152 are not provided.

Correspondingly, for the manufacturing method, in an embodiment, the step S3 is entirely omitted.

In another embodiment, omitted in the step S3 are: forming the N electrode 151 on the exposed part of N-type semiconductor layer 11, forming the ohmic contact between the N electrode 151 and the N-type semiconductor layer 11, forming the P electrode 152 on the activated region 131, and forming the ohmic contact between the P electrode 152 and the activated region 131.

The semiconductor structure 6 can be manufactured and sold as a semi-finished product.

Although the present disclosure is disclosed as above, the present disclosure is not limited thereto. Any person skilled in the art can make various changes and modifications without departing from the spirit and scope of the present disclosure. Therefore, the protection scope of the present disclosure should be subject to the scope defined by the claims.

The invention claimed is:

1. A semiconductor structure, comprising:
an N-type semiconductor layer, a P-type ion doped layer, and a light emitting layer between the N-type semiconductor layer and the P-type ion doped layer, wherein the P-type ion doped layer comprises an activated region and non-activated regions located on two sides of the activated region, H atoms in the activated region escape to active P-type doping ions in the activated region, and H atoms in the non-activated region do not escape to passivate P-type doping ions in the non-activated regions; and
wherein the semiconductor structure further comprises an electron blocking layer between the light emitting layer and the P-type ion doped layer;
wherein the electron blocking layer comprises a first region and a second region, H atoms in the first region escape to active P-type doping ions in the first region, an orthographic projection of the first region on a plane where the N-type semiconductor layer is located coincides with an orthographic projection of the activated region of the P-type ion doped layer on the plane where the N-type semiconductor layer is located; and H atoms in the second region do not escape to passivate P-type doping ions in the second region, an orthographic projection of the second region on the plane where the N-type semiconductor layer are located coincides with orthographic projection of the non-activated region of the P-type ion doped layer on the plane where the N-type semiconductor layer is located.

2. The semiconductor structure according to claim 1, wherein the P-type ion doped layer comprises at least two activated regions and at least three non-activated regions, and the at least two activated regions and the at least three non-activated regions are distributed at intervals.

3. The semiconductor structure according to claim 1, further comprising: a blocking layer located on the non-activated regions to expose the activated region.

4. The semiconductor structure according to claim 3, wherein materials of the blocking layer comprise: $SiN_x$, N-type GaN, or a combination of $SiN_x$ and N-type GaN.

5. The semiconductor structure according to claim 2, wherein parts of the light emitting layer and the P-type ion doped layer are removed to expose a part of the N-type semiconductor layer, an N electrode is provided on the part of the N-type semiconductor layer that is exposed, and an ohmic contact is formed between the N electrode and the N-type semiconductor layer; P electrodes are provided on the at least two activated regions, and an ohmic contact is formed between the P electrode and the corresponding activated region.

6. The semiconductor structure according to claim 5, wherein the P electrodes on the at least two activated regions are electrically connected together.

7. The semiconductor structure according to claim 1, wherein materials of the N-type semiconductor layer comprise group III nitride materials, and/or materials of the light emitting layer comprise group III nitride materials, and/or materials of the P-type ion doped layer comprise group III nitride materials.

8. A method of manufacturing a semiconductor structure according to claim 1, comprising:
providing an N-type semiconductor layer, a P-type ion doped layer, a light emitting layer between the N-type semiconductor layer and the P-type ion doped layer, and a blocking material layer on the P-type ion doped layer;
patterning the blocking material layer to form a blocking layer, wherein the blocking layer has at least one opening to expose a part of the P-type ion doped layer;
activating, by the blocking layer as a mask, P-type doping ions in the part of the P-type ion doped layer that is exposed to form an activated region, wherein H atoms in the activated region escape to active P-type doping ions in the activated region;
determining an unexposed part of the P-type ion doped layer covered by the blocking layer as non-activated regions, wherein H atoms in the non-activated region do not escape to passivate P-type doping ions in the non-activated regions; and
providing an electron blocking layer between the light emitting layer and the P-type ion doped layer;
wherein the electron blocking layer comprises a first region and a second region, H atoms in the first region escape to active P-type doping ions in the first region, an orthographic projection of the first region on a plane where the N-type semiconductor layer is located coincides with an orthographic projection of the activated region of the P-type ion doped layer on the plane where the N-type semiconductor layer is located; and H atoms in the second region do not escape to passivate P-type doping ions in the second region, an orthographic projection of the second region on the plane where the N-type semiconductor layer are located coincides with orthographic projection of the non-activated region of the P-type ion doped layer on the plane where the N-type semiconductor layer is located.

9. The method of manufacturing a semiconductor structure according to claim 8, wherein there are a plurality of openings in the blocking layer to form at least two activated regions and at least three non-activated regions, and the activated regions and the non-activated regions are distributed at intervals.

10. The method of manufacturing a semiconductor structure according to claim 8, further comprising: removing the blocking layer to expose the non-activated regions.

11. The method of manufacturing a semiconductor structure according to claim 8, wherein materials of the blocking material layer comprise: $SiN_x$, N-type GaN or a combination of $SiN_x$ and N-type GaN.

12. The method of manufacturing a semiconductor structure according to claim 8, wherein the P-type doping ions are activated through annealing at a temperature greater than 500° C.

13. The method of manufacturing a semiconductor structure according to claim 12, wherein the P-type doping ions are activated in an atmosphere of nitrogen, a mixed gas of nitrogen and oxygen, nitrous oxide, or argon.

14. The method of manufacturing a semiconductor structure according to claim 8, wherein a growth temperature of the P-type ion doped layer is in a range from 700° C. to 1200° C.

15. The method of manufacturing semiconductor structure according to claim 8, further comprising:

removing pars of the P-type ion doped layer and the light emitting layer to expose a part of the N-type semiconductor layer;

forming an N electrode on the part of N-type semiconductor layer that is exposed;

forming an ohmic contact between the N electrode and the N-type semiconductor layer;

forming a P electrode on the activated region; and forming an ohmic contact between the P electrode and the activated region.

16. The method of manufacturing a semiconductor structure according to claim 8, wherein materials of the N-type semiconductor layer comprise group III nitride materials, and/or materials of the light emitting layer comprise group III nitride materials, and/or materials of the P-type ion doped layer comprise group III nitride materials.

17. The semiconductor structure according to claim 3, further comprising: a passivation layer, wherein the passivation layer is on
- an upper surface of an exposed part of the blocking layer,
- an upper surface of an exposed part of the N-type semiconductor layer, and
- side surfaces of layers of the blocking layer and the activated region and the light emitting layer.

18. The method of manufacturing a semiconductor structure according to claim 8, further comprising: providing a passivation layer on
- an upper surface of an exposed part of the blocking layer,
- an upper surface of an exposed part of the N-type semiconductor layer, and
- side surfaces of layers of the blocking layer and the activated region and the light emitting layer.

* * * * *